(12) United States Patent
Zhang

(10) Patent No.: US 9,739,811 B2
(45) Date of Patent: Aug. 22, 2017

(54) OVERCURRENT DETECTOR

(71) Applicant: TEXAS INSTRUMENTS INCORPORATED, Dallas, TX (US)

(72) Inventor: Gangqiang Zhang, Plano, TX (US)

(73) Assignee: Texas Intruments Incorporated, Dallas, TX (US)

(*) Notice: Subject to any disclaimer, the term of this patent is extended or adjusted under 35 U.S.C. 154(b) by 181 days.

(21) Appl. No.: 14/699,554

(22) Filed: Apr. 29, 2015

(65) Prior Publication Data
US 2015/0309087 A1 Oct. 29, 2015

Related U.S. Application Data

(60) Provisional application No. 61/985,817, filed on Apr. 29, 2014.

(51) Int. Cl.
G01R 19/00 (2006.01)
G01R 31/26 (2014.01)
G01R 19/165 (2006.01)

(52) U.S. Cl.
CPC .......... *G01R 19/16571* (2013.01); *H03K 2217/0027* (2013.01); *H03K 2217/0063* (2013.01)

(58) Field of Classification Search
CPC .......... G01R 19/0092; G01R 31/2621; G01R 31/2608; G01R 19/16571; H03K 2217/0063; H03K 2217/0027

USPC ..................................................... 324/762.01
See application file for complete search history.

(56) References Cited

U.S. PATENT DOCUMENTS

| | | | | |
|---|---|---|---|---|
| 5,867,014 A | * | 2/1999 | Wrathall | G01R 19/0092 323/315 |
| 5,903,422 A | * | 5/1999 | Hosokawa | G01R 19/0092 327/427 |
| 2010/0164528 A1 | * | 7/2010 | Rahman | G01R 35/005 324/762.01 |
| 2011/0133711 A1 | * | 6/2011 | Murakami | H03K 17/0822 323/282 |

* cited by examiner

*Primary Examiner* — Jermele M Hollington
*Assistant Examiner* — Zannatul Ferdous
(74) *Attorney, Agent, or Firm* — Lawrence J. Bassuk; Charles A. Brill; Frank D. Cimino

(57) ABSTRACT

An overcurrent detector that includes a sense transistor connected to a sense resistor, a second transistor matched to the sense transistor and connected in parallel to a second resistor, and a voltage comparator coupled to the sense transistor and second resistor. The sense transistor is configured to connect in a same gate and source connection with a driver output transistor. The second transistor and second resistor are configured to receive a current reference and generate a voltage reference. The voltage comparator is configured to compare the voltage reference with a voltage drop across the sense resistor.

15 Claims, 2 Drawing Sheets

OVERCURRENT DETECTOR

CROSS-REFERENCE TO RELATED APPLICATIONS

The present application claims priority to U.S. Provisional Patent Application No. 61/985,817, filed Apr. 29, 2014, titled "High Speed High Accuracy Over-Current Detector For High-Side Switch," which is hereby incorporated herein by reference in its entirety.

BACKGROUND

Drivers are circuits used to regulate the current flowing through another circuit or device such as a high-powered transistor or a high power switch in a switched-mode power converter. In order to protect the circuit or device that the driver is regulating from damaging currents, an overcurrent detector may be utilized to determine whether the driver is generating an excess current above a threshold value. The overcurrent detector acts to detect the amount of current flowing through the protected device, and if the current is above the threshold value, the overcurrent detector may cause the current in the driver that is flowing to the protected device to cut off. In that way, the protected device is protected from any potentially damaging currents.

SUMMARY

The problems noted above are solved in large part by systems and methods for detecting overcurrent in drive circuit systems. In some embodiments, an overcurrent detector includes a sense transistor connected to a sense resistor, a second transistor matched to the sense transistor and connected in parallel to a second resistor, and a voltage comparator coupled to the sense transistor and second resistor. The sense transistor is configured to connect in a same gate and source connection with a driver output transistor. The second transistor and second resistor are configured to receive a current reference and generate a voltage reference. The voltage comparator is configured to compare the voltage reference with a voltage drop across the sense resistor.

Another illustrative embodiment is a switch mode drive system comprising a bootstrap regulator, a driver output transistor coupled to the bootstrap regulator, and an overcurrent detector coupled to the bootstrap regulator. The overcurrent detector is configured to generate an overcurrent output signal based on a current through the driver output transistor being above a threshold value. The overcurrent detector includes a sense transistor coupled to a sense resistor and the driver output transistor, a voltage comparator, and a second transistor coupled in parallel to a second resistor and configured to receive a current reference and generate a voltage reference. The second transistor is matched to the sense transistor. The voltage comparator is configured to compare the voltage reference with a voltage drop across the sense resistor.

Yet another illustrative embodiment is an overcurrent detector comprising a sense transistor coupled with a driver output transistor and matched with a second transistor, a sense resistor matched with a second resistor, a voltage reference duplication circuit, and a voltage comparator coupled to the sense transistor and voltage reference duplication circuit. The sense transistor is configured to receive an output of the driver output transistor. The sense resistor is coupled in series with the sense transistor. The second transistor is connected in parallel with the second resistor and configured to receive a current reference and generate a voltage reference. The voltage reference duplication circuit is configured to receive and duplicate the voltage reference. The voltage comparator is configured to receive and compare the voltage reference and a voltage drop across the sense resistor and output an overcurrent signal based on the voltage reference being less than the voltage drop across the sense resistor.

BRIEF DESCRIPTION OF THE DRAWINGS

For a detailed description of various examples, reference will now be made to the accompanying drawings in which.

NOTATION AND NOMENCLATURE

Figure 1:
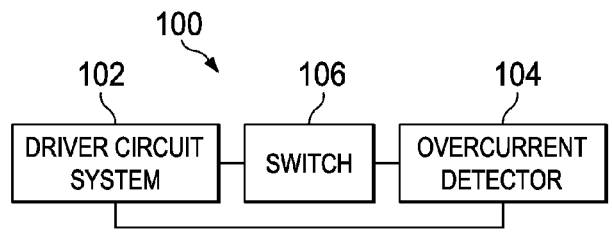
FIG. 1 shows a block diagram of an illustrative power converter system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Drivers are utilized to regulate current flowing through another circuit or device such as a high-powered transistor acting as a switch in a switch mode power converter. In order to protect the circuit being driven, such as a high-powered transistor switch, typically an overcurrent detector is designed to detect if the current flowing through the protected circuit is above a threshold value. If the current through the protected circuit is above the threshold value, the overcurrent detector may be configured to output an overcurrent signal that causes the current through the protected circuit to stop flowing or reduce to a level below the threshold value.

One type of conventional overcurrent detector may include a sense transistor and sense resistor connected across the protected circuit, a bias resistor, and a voltage comparator. A reference current, at the threshold value, flowing through the bias resistor generates a reference voltage which is compared with the voltage drop across the sense resistor to determine if an overcurrent exists in the protected circuit. However, the overcurrent threshold on the protected circuit is dependent on the resistance of the sense resistor and the on resistance of the sense transistor. Thus, variation over process and temperature reduces the accuracy of the overcurrent detector. Therefore, while these types of overcurrent detectors may achieve high speeds because the inputs to the voltage comparator have little swing and encounter low impedance, the sensing error is high.

Another type of conventional overcurrent detector utilizes a sense transistor, an operational amplifier, an NMOS current mirror and an output buffer. The amplifier causes the drain to source voltage of the sense transistor to be the same as the drain to source voltage of the protected circuit. Therefore, the drain current of sense transistor is 1/m the drain current of the protected circuit (where m is a constant value). The NMOS current mirror duplicates the sense transistor current and compares that with a reference current to determine if an overcurrent exists in the protected circuit. Thus, the overcurrent threshold on the protected circuit only depends on the reference current and not on the resistance of any resistor or transistor. Therefore, these types of overcurrent detectors are accurate over process and/or temperature variations. However, the operational amplifier is connected to a switching node that includes large voltage swings and fast transients. Thus, the amplifier required in these overcurrent detectors must be a high speed, wide input range amplifier. These types of amplifiers are difficult to design and costly to implement.

Because conventional current detectors have deficiencies, there is a need for an overcurrent detector that is both accurate over process and/or temperature variations and which does not require high speed, wide input range amplifiers. A transistor in parallel with a resistor may receive a current reference and produce a voltage reference that varies over process and temperature. The transistor is matched with a sense transistor that is coupled to a sense resistor, both of which are connected across the protected circuit. Because the sense transistor is matched to the transistor that produces the voltage reference, the threshold current through the protected circuit does not depend on the resistance of any resistor or transistor in the overcurrent detector. This reference voltage is then compared with the voltage drop across the sense resistor to determine if an overcurrent condition exists in the protected circuit. Because the threshold current through the protected circuit does not depend on the resistance of any resistor or transistor in the overcurrent detector, the accuracy of the overcurrent detector is maintained through process and temperature variations. While an amplifier may be utilized to duplicate the voltage reference, the amplifier is only connected to direct current signals with no transients present. Therefore, the overcurrent detector does not need any costly high speed, wide input range amplifiers. Thus, the overcurrent detector provides high speed, accurate overcurrent protection without the need for costly, difficult to design amplifiers.

FIG. 1 shows a block diagram of an illustrative power converter system 100 in accordance with various embodiments. Power converter system 100 may include drive circuit system 102, overcurrent detector 104, and switch 106. In an embodiment, drive circuit system 102 is configured to regulate the current flowing through another device such as switch 106 in power converter system 100. In alternative embodiments, drive circuit system 102 is configured to regulate the current of or control any other electrical circuit or device including any high-power transistor or liquid crystal display (LCD).

Overcurrent detector 104 may be a circuit designed to determine whether the current flowing through switch 106, or any other circuit or device driver 102 is regulating, is above a threshold value. Overcurrent detector 104 may be connected in parallel with switch 106 to allow for overcurrent detector 104 to determine the voltage and/or current flowing through switch 106. The threshold value may be any current level and may be programmable within overcurrent detector 104 through the use of a current reference. The threshold value is usually a current level at which, if the current is above the threshold value, an excess current exists. In other words, if the current is above the threshold value, the electric current flowing through switch 106, or any other circuit or device drive circuit system 102 is regulating, causes excessive heat generation and the risk of damage to the protected circuit or device. If overcurrent detector 104 determines that the current flowing through switch 106, or any other protected circuit or device, is above the threshold value, overcurrent detector 104 may cause, by generating an overcurrent signal, the current flowing through the driver to switch 106, or any other protected circuit or device, to cut off or reduce in value. In this way, overcurrent detector 104 acts to protect switch 106, or any other circuit or device drive circuit system 102 is regulating, from the dangers of excessive current.

Power converter system 100 may be a switched-mode power supply which incorporates a plurality of switches, including switch 106 to convert electrical power. In alternative embodiments, power converter system 100 may be any other type of power supply, voltage regulator, or device to convert electric energy from one form to another (e.g., converting AC to DC, DC to AC, changing frequency of a power signal, and/or changing the voltage of a power supply signal). Power converter system 100 may transfer power from mains power to be utilized by a load. The load may be any type of electrical equipment (e.g., a personal computer).

Switch 106, in an embodiment, is a transistor which is regulated by drive circuit system 102. In some embodiments, switch 106 is a high powered field-effect transistor (FET) and more particularly may be an n-channel metal-oxide semiconductor field-effect (NMOS) transistor. In alternative embodiments, switch 106 may be any other type of switch including a p-channel metal-oxide-semiconductor field-effect (PMOS) transistor, a p-type junction gate field-effect transistor (PJFET), a n-type junction gate field-effect transistor (NJFET), and a bipolar junction transistor (BJT) (including PNP and NPN transistors). In some embodiments, switch 106 is a high side switch because the load is taken through its source to ground. In alternative embodiments, switch 106 is a low side switch. In an embodiment, switch 106 may have a channel width to length ratio of:

$$\text{Switch 106 channel width to length ratio} = m\left(\frac{W}{L}\right)$$

where m is a constant value; W is the width of the channel; and L is the length of the channel. Additionally, switch 106 may have an on resistance of $R_{on}$.

Drive circuit system 102 may cause switch 106 to switch between on and off states. By varying the ratio of the on time to off time for the switches, including switch 106, the voltage converted by power converter system 100 may be regulated. Because the drive circuit system 102 causes switch 106 to switch between on and off states, drive circuit system 102 may be termed a switch mode drive circuit system.

Figure 2:
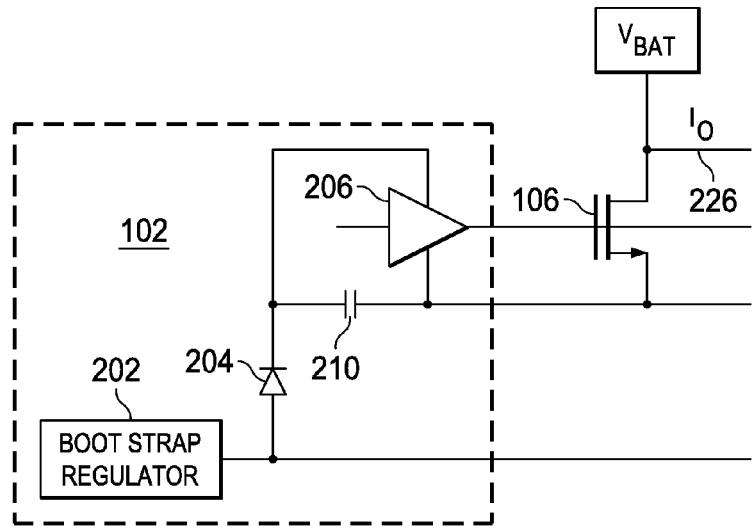
FIG. 2 shows a circuit diagram of an illustrative drive circuit system in accordance with various embodiments.

FIG. 2 shows a circuit diagram of drive circuit system 102 in accordance with various embodiments. Drive circuit system 102 may include bootstrap regulator 202, diode 204, driver 206, and bootstrap capacitor 210. Bootstrap regulator 202 is a voltage supply regulator that provides a constant voltage and current to driver 206 through diode 204 and boot capacitor 210. Bootstrap regulator 202 also provides a constant current to overcurrent detector 104. Diode 204 has a low resistance to current in the direction of the voltage travelling from bootstrap regulator 202 to bootstrap capacitor 210 and a high resistance to current in the opposite direction. Thus, diode 204 allows bootstrap regulator 210 to provide voltage to driver 206 while blocking any return current and/or voltage from reaching bootstrap regulator 202. Bootstrap capacitor 210 is configured to store the electrical energy provided by bootstrap regulator 202 such that the voltage provided by bootstrap capacitor 210 rises above the voltage provided by bootstrap regulator 202. This enables, after flowing through driver 206, the voltage 228 applied to the gate of switch 106 to be high enough to bias switch 106 into linear operation (i.e., turn on).

Driver 206 acts to regulate and control switch 106. In other words, driver 206 provides the voltage to the gate of switch 106 to turn on switch 106. Driver 206 is configured to lower the voltage to the gate of switch 106 to turn off switch 106. In this way, driver 206 controls the switching of switch 106. In some embodiments, driver 206 is a high side driver while in other embodiments; driver 206 may be a low side driver. Because, in some embodiments, switch 106 is a transistor that is controlled by driver 206, switch 106 may be termed a driver output transistor. Signal 226 is applied to the drain of switch 106 while the bootstrap regulator 202 voltage 222 flows to the overcurrent detector 104.

Figure 3:
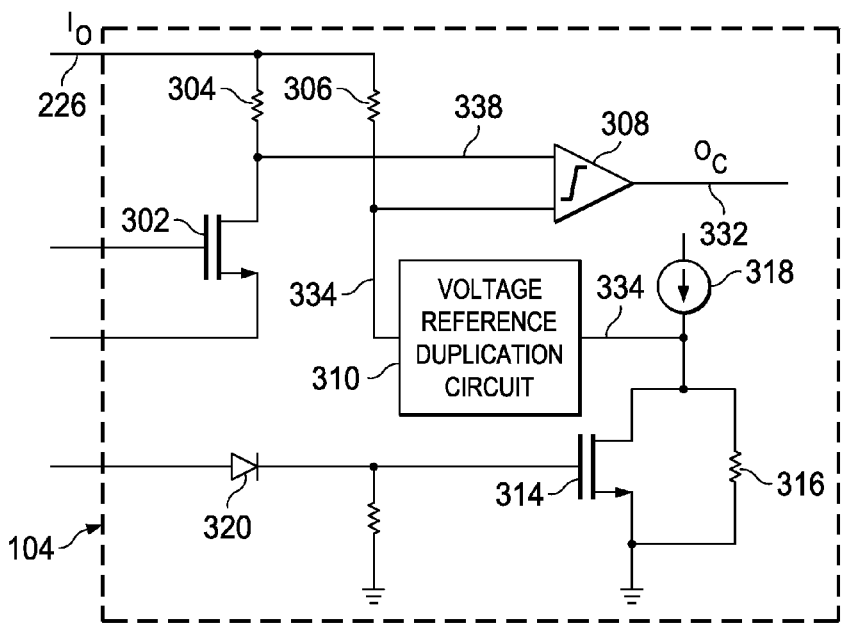
FIG. 3 shows a circuit diagram of an illustrative overcurrent detector in accordance with various embodiments.

FIG. 3 shows a circuit diagram of overcurrent detector 104 in accordance with various embodiments. Overcurrent detector 104 may include sense transistor 302, sense resistor 304, resistor 306, voltage comparator 308, voltage reference duplication circuit 310, transistor 314, resistor 316, current reference 318, and diode 320. In some embodiments, sense transistor 302 is a field-effect transistor (FET) and more particularly may be an n-channel metal-oxide semiconductor field-effect (NMOS) transistor. In alternative embodiments, sense transistor 302 may be any other type of switch including a p-channel metal-oxide-semiconductor field-effect (PMOS) transistor, a p-type junction gate field-effect transistor (PJFET), a n-type junction gate field-effect transistor (NJFET), and a bipolar junction transistor (BJT) (including PNP and NPN transistors). Sense transistor 302 is connected across switch 106 in a same gate and source connection with switch 106. Sense transistor 302 receives voltage 228 at its gate.

In an embodiment, sense transistor 302 may have a channel width to length ratio of:

$$\text{Sense Transistor 302 channel width to length ratio} = \frac{W}{L}$$

where W is the width of the channel; and L is the length of the channel. Thus, the width to length ratio of sense transistor 302 may be related to the width to length ratio of switch 106. Additionally, sense transistor 302 may have an on resistance of $mR_{on}$ where m is a constant and $R_{on}$ is the on resistance of switch 106. Therefore, the on resistance of sense transistor 302 may be related to the on resistance of switch 106.

Sense resistor 304 is connected in series with sense transistor 302, and is therefore connected in parallel across switch 106. Thus, the voltage drop across sense resistor 304 is the voltage flowing into switch 106. This voltage 338 represents the current flowing into switch 106. Therefore, the voltage drop across sense resistor 304 is compared with a voltage reference to determine whether the current through switch 106 is above the threshold value and needs to be turned off or reduced.

Current reference 318 generates a steady voltage representative of the threshold current level that is to be compared with the current through switch 106. Transistor 314 is a field-effect transistor (FET) and more particularly may be an n-channel metal-oxide semiconductor field-effect (NMOS) transistor. In alternative embodiments, transistor 314 may be any other type of switch including a p-channel metal-oxide-semiconductor field-effect (PMOS) transistor, a p-type junction gate field-effect transistor (PJFET), a n-type junction gate field-effect transistor (NJFET), and a bipolar junction transistor (BJT) (including PNP and NPN transistors). Transistor 314 is matched with sense transistor 302. Thus, transistor 314 has the same characteristics as sense transistor 302, such as the same channel width, channel length, on resistance, and gate to source voltage.

In an embodiment, transistor 314 may have a channel width to length ratio of:

$$\text{Sense Transistor 314 channel width to length ratio} = \frac{W}{L}$$

where W is the width of the channel; and L is the length of the channel. Thus, the width to length ratio of transistor 314 may be related to the width to length ratio of switch 106 and equal to the width to length ratio of sense transistor 302. Additionally, transistor 314 may have an on resistance of $mR_{on}$ where m is a constant and $R_{on}$ is the on resistance of switch 106. Therefore, the on resistance of transistor 314 may be related to the on resistance of switch 106 and equal to the on resistance of sense transistor 302.

Bootstrap regulator 202 provides a constant voltage and current to transistor 314 through diode 320. Diode 320 may be matched to diode 204 from FIG. 2. Therefore, diode 320 has the same characteristics as diode 204, such as the same resistance. Because bootstrap regulator is providing voltages to sense transistor 302 and to transistor 314, the gate to source voltage of sense transistor 302 equals the gate to source voltage of transistor 314.

Resistor 316 is connected in parallel with transistor 314 and is matched to sense resistor 302. Thus, resistor 316 has the same characteristics as sense resistor 306, such as the same resistance. Transistor 314 and resistor 316 receive the current reference signal from current reference 318 and produce a voltage reference 334. The voltage reference 334 is equal to:

$$V_{Ref} = I_{Ref}\left(\frac{R_{316}mR}{(R_{316} + mR_{on})}\right)$$

where $V_{Ref}$ is the voltage reference 334; $I_{Ref}$ is the current reference current; $R_{316}$ is the resistance of resistor 316; $mR_{on}$ is the on resistance of transistor 314 which equals the on resistance of sense transistor 302 because transistor 314 and sense transistor 302 are matched, $R_{on}$ being the on resistance of switch 106 and in being a constant. Thus, as the on resistance of transistor 314 changes due to variation over process and temperature, voltage reference 334 changes as well.

Voltage reference 334 is received by voltage reference duplication circuit 310. Voltage reference duplication circuit 310 duplicates the voltage reference 334 such that voltage comparator 308 receives the voltage reference 334 to compare with the voltage drop across sense resistor 304. Voltage comparator 308 compares voltage reference 334 with the voltage drop across sense resistor 304 to determine if an overcurrent condition through switch 106 exists. If the voltage drop across sense resistor 304 is higher than voltage reference 334, then voltage comparator 308 may cause an overcurrent signal 332 to be generated. Overcurrent signal 332 may cause current to stop flowing through switch 106 or cause the current flowing through switch 106 to be reduced.

Figure 4:
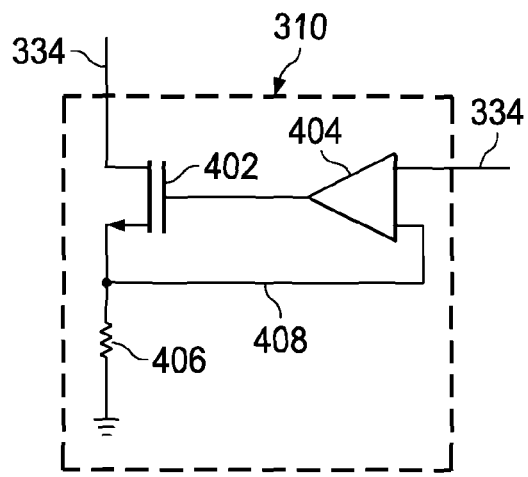
FIG. 4 shows a circuit diagram of an illustrative voltage reference duplication circuit in accordance with various embodiments.

FIG. 4 shows a circuit diagram of voltage reference duplication circuit 310 in accordance with various embodiments. Voltage reference duplication circuit 310 may comprise transistor 402, amplifier 404, and resistor 406. Amplifier 404 may be a negative feedback operational amplifier that receives, as its input, voltage reference 334 and negative feedback signal 408. In some embodiments resistor 406 is matched with resistor 306 from FIG. 3. Thus, resistor 406 has the same characteristics as resistor 306, such as the same resistance.

Because voltage reference 334 is duplicated by voltage reference duplication circuit 310, the voltage across resistor 306 is shown by:

$$V_{R_{306}} = I_{R_{306}}R_{306} = I_{R_{406}}R_{406} = V_{Ref}$$

where $V_{R_{306}}$ is the voltage across resistor 306; $I_{R_{306}}$ is the current through resistor 306; $R_{306}$ is the resistance of resistor 306; $I_{R_{406}}$ is the current through resistor 406; $R_{406}$ is the resistance of resistor 406; and $V_{Ref}$ is the voltage reference 334. Furthermore, the voltage across sense resistor 304 is shown by:

$$V_{R_{304}} = I_o R_{on}\left(\frac{R_{304}}{R_{304} + mR_{on}}\right)$$

where $V_{R_{304}}$ is the voltage across sense resistor 304; $I_o$ is the threshold current through switch 106 flowing through signal 226; $R_{on}$ is the on resistance of switch 106; $R_{304}$ is the resistance of resistor 304 which equals the resistance of resistor 316 because resistors 304 and 306 are matched; and $mR_{on}$ is the on resistance of sense transistor 302 which equals the on resistance of transistor 314 because transistor 314 and sense transistor 302 are matched, $R_{on}$ being the on resistance of switch 106 and m being a constant.

As shown above, at the threshold current, the voltage drop across resistor 306 equals voltage reference 334. At the threshold current, where $V_{R_{306}} = V_{R_{304}}$, comparing expressions of $V_{R_{306}}$ and $V_{R_{304}}$, and taking into account that the resistance of sense resistor 304 equals the resistance of resistor 316, the threshold current level flowing through switch 106 in signal 226 is:

$$I_o = I_{Ref} m$$

where $I_o$ is the threshold current through switch 106 flowing through signal 226; $I_{Ref}$ is the current produced by current reference 318; and m is a constant. Thus, the threshold current flowing through switch 106 in signal 226 does not depend on the on resistance of any of the transistors 302, 314, 402, switch 106, or any of resistors 304, 306, 406, 316. Therefore, the comparison by voltage comparator 308 is accurate even with a variation over process and temperature.

Furthermore, because amplifier 404 only receives voltage reference 334, amplifier 404 works only in a direct current (DC) condition without any transients present. Therefore, amplifier 404 need not be a high speed/wide input range operational amplifier in order to maintain a fast response within overcurrent detector 104. This is because the signal path through overcurrent detector 104 encounters no high impedance nodes.

Figure 5:
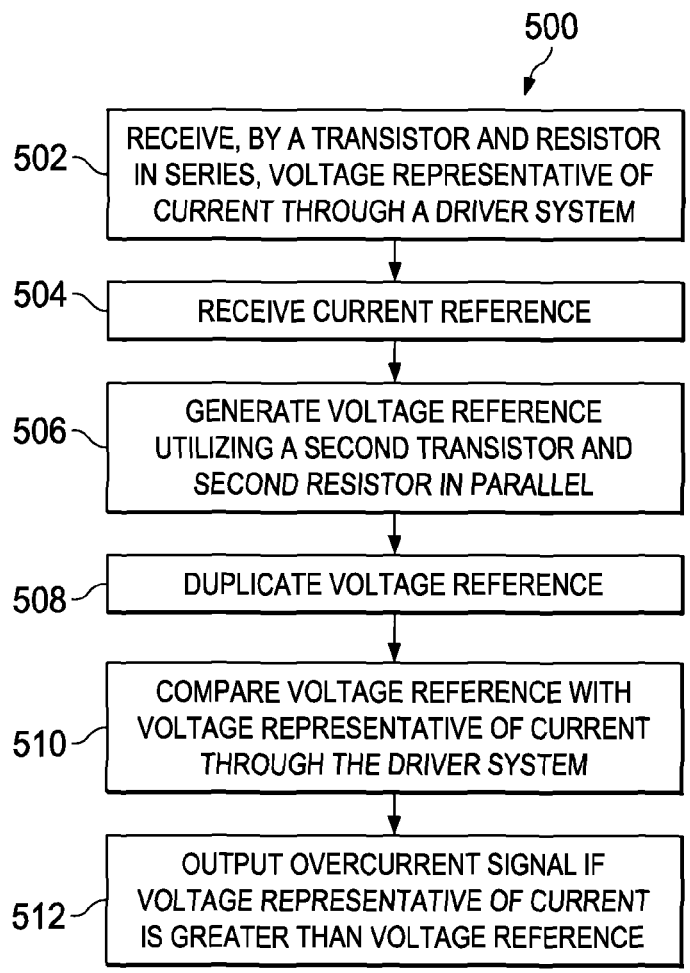
FIG. 5 shows a flow diagram of a method for detecting overcurrent in accordance with various embodiments.

FIG. 5 shows a flow diagram of a method 500 for detecting overcurrent in accordance with various embodiments. Though depicted sequentially as a matter of convenience, at least some of the actions shown in method 500 can be performed in a different order and/or performed in parallel. Additionally, some embodiments may perform only some of the actions shown or may perform additional actions. In some embodiments, at least some of the operations of the method 500, as well as other operations described herein, can be performed by overcurrent detector 104 implemented by a processor executing instructions stored in a non-transitory computer readable storage medium.

The method 500 begins in block 502 with receiving, by sense transistor 302 in series with sense resistor 304, a voltage representative of a current through driver circuit system 102. In block 504, the method 500 continues with receiving a current from current reference 318. Transistor 314 and resistor 316 connected together in parallel, may receive the current from current reference 318.

In block 506, the method 500 continues with generating voltage reference 334 utilizing transistor 314 and resistor 316 connected together in parallel. The method 500 continues in block 508 with duplicating voltage reference 334. The duplication of voltage reference 334 may be accomplished utilizing voltage reference duplication circuit 310.

In block 510, the method 500 continues with comparing, utilizing voltage comparator 308, voltage reference 334 with voltage representative of current through the driver circuit system 102. The voltage representative of current through the driver circuit system 102 may be the voltage drop across sense resistor 304. The method 500 continues in block 512 with outputting an overcurrent signal 332 if the voltage representative of current through driver circuit system 102 (i.e., the voltage drop across sense resistor 304) is greater than voltage reference 334.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An overcurrent detector comprising:
a sense transistor connected to a sense resistor, the sense transistor configured to connect in a same gate and source connection with a driver output transistor;
a second transistor matched to the sense transistor and connected in parallel to a second resistor, the second transistor and second resistor configured to receive a current reference and generate a voltage reference;
a voltage comparator coupled to the sense transistor and second resistor, the voltage comparator configured to compare the voltage reference with a voltage drop across the sense resistor;
a voltage reference duplication circuit connected to the voltage comparator, the voltage reference duplication circuit configured to duplicate the voltage reference; and
a third resistor connected in series with the voltage reference duplication circuit, wherein the voltage reference utilized by the voltage comparator for comparison with the voltage drop across the sense resistor is a voltage drop across the third resistor.

2. The overcurrent detector of claim 1, wherein the sense resistor is matched to the second resistor.

3. The overcurrent detector of claim 1, wherein, based on the voltage reference being less than voltage drop across the sense resistor, the voltage comparator is configured to generate an overcurrent output signal.

4. The overcurrent detector of claim 1, wherein the voltage reference duplication circuit comprises an amplifier, a third transistor, and a fourth resistor, the amplifier receiving the voltage reference from the second resistor and second transistor.

5. The overcurrent detector of claim 4, wherein the third resistor is matched to the fourth resistor.

6. The overcurrent detector of claim 4, wherein the amplifier is configured as a negative feedback operation amplifier.

7. The overcurrent detector of claim 1, wherein the second transistor gate to source voltage equals the sense transistor gate to source voltage.

8. The overcurrent detector of claim 7, wherein the sense transistor and the second transistor are powered by a bootstrap regulator.

9. A switch mode driver system comprising:
a bootstrap regulator;
a driver output transistor coupled to the bootstrap regulator; and
an overcurrent detector coupled to the bootstrap regulator and driver output transistor, the overcurrent detector configured to generate an overcurrent output signal based on a current through the driver output transistor being above a threshold value; the overcurrent detector including:
a sense transistor coupled to a sense resistor and the driver output transistor,
a voltage comparator, and
a second transistor coupled in parallel to a second resistor and configured to receive a current reference and generate a voltage reference, the second transistor matched to the sense transistor;
wherein the voltage comparator is configured to compare the voltage reference with a voltage drop across the sense resistor;
a voltage reference duplication circuit connected to the voltage comparator, the voltage reference duplication circuit configured to duplicate the voltage reference; and
a third resistor connected in series with the voltage reference duplication circuit, wherein the voltage reference utilized by the voltage comparator for comparison with the voltage drop across the sense resistor is a voltage drop across the third resistor.

10. The switch mode driver system of claim 9, wherein the switch mode driver is a high side switch mode driver.

11. The switch mode driver system of claim 9, further comprising a bootstrap capacitor coupled to the bootstrap regulator, the driver output transistor, and the sense transistor.

12. The switch mode driver system of claim 9, wherein the bootstrap regulator is configured to power the sense transistor, and the second transistor.

13. The switch mode driver system of claim 9, wherein the second resistor is matched to the sense resistor.

14. An overcurrent detector, comprising:
a sense transistor coupled with a driver output transistor and matched with a second transistor, the sense transistor configured to receive an output of the driver output transistor;
a sense resistor matched with a second resistor, the sense resistor coupled in series with the sense transistor;
a voltage reference duplication circuit; and
a voltage comparator coupled to the sense transistor and voltage reference duplication circuit;
wherein the second transistor is connected in parallel with the second resistor and configured to receive a current reference and generate a voltage reference;
wherein the voltage reference duplication circuit is configured to receive and duplicate the voltage reference;
wherein the voltage comparator is configured to receive and compare the voltage reference and a voltage drop across the sense resistor and output an overcurrent signal based on the voltage reference being less than the voltage drop across the sense resistor; and
wherein the voltage reference duplication circuit includes a negative feedback amplifier configured to receive the voltage reference from the second transistor and second resistor, the negative feedback amplifier coupled to a third transistor, the third transistor coupled to a third and fourth resistor, the third resistor matching the fourth resistor, wherein the voltage reference utilized by the voltage comparator for comparison with the voltage drop across the sense resistor is a voltage drop across the third resistor.

15. The overcurrent detector of claim 14, wherein a gate to source voltage of the sense transistor, and the second transistor are equal.

* * * * *